US012666526B2

(12) United States Patent
Zhang

(10) Patent No.: US 12,666,526 B2
(45) Date of Patent: Jun. 23, 2026

(54) SUBSTRATE STRUCTURE AND TERMINAL DEVICE

(71) Applicant: Huawei Digital Power Technologies Co., Ltd., Shenzhen (CN)

(72) Inventor: Kai Zhang, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 200 days.

(21) Appl. No.: 18/444,961

(22) Filed: Feb. 19, 2024

(65) Prior Publication Data

US 2024/0196513 A1      Jun. 13, 2024

Related U.S. Application Data

(63) Continuation of application No. PCT/CN2022/099101, filed on Jun. 16, 2022.

(30) Foreign Application Priority Data

Sep. 30, 2021    (CN) .......................... 202111161406.4

(51) Int. Cl.
*H05K 1/00*          (2006.01)
*H05K 1/02*          (2006.01)

(52) U.S. Cl.
CPC ......... *H05K 1/0203* (2013.01); *H05K 1/0272* (2013.01)

(58) Field of Classification Search
CPC ........................... H05K 1/0203; H05K 1/0272
See application file for complete search history.

(56) References Cited

U.S. PATENT DOCUMENTS

| | | | |
|---|---|---|---|
| 10,542,640 B1 | 1/2020 | Leigh et al. | |
| 2015/0042342 A1 | 2/2015 | Albrecht | |
| 2016/0013173 A1 | 1/2016 | Vadhavkar et al. | |

(Continued)

FOREIGN PATENT DOCUMENTS

| | | |
|---|---|---|
| CN | 102510709 A | 6/2012 |
| CN | 212573097 U | 2/2021 |

(Continued)

OTHER PUBLICATIONS

DE 19734054 A1; published in 1998; English Translation (Year: 1998).*

*Primary Examiner* — Pete T Lee
(74) *Attorney, Agent, or Firm* — Conley Rose, P.C.

(57)          ABSTRACT

A substrate structure includes a frame body, a cooling housing, and a first chip. The frame body includes a first wall plate and a second wall plate that are disposed at a spacing. An accommodation cavity is formed between the first wall plate and the second wall plate. The cooling housing is at least partially disposed in the accommodation cavity, and is fastened to the frame body. A cooling cavity is formed between the cooling housing and the second wall plate. The first chip is disposed in the cooling cavity, and is connected to the second wall plate. The cooling cavity is configured to be filled by cooling fluid that immerses the first chip. The first chip is mounted in the substrate structure in a form of chip embedding. The cooling housing in the frame body forms the cooling cavity for circulating the cooling fluid.

20 Claims, 13 Drawing Sheets

(56) References Cited

U.S. PATENT DOCUMENTS

| | | | |
|---|---|---|---|
| 2019/0385928 | A1 | 12/2019 | Leobandung |
| 2020/0214169 | A1 | 7/2020 | Tsunoda |
| 2020/0328139 | A1 | 10/2020 | Chiu et al. |

FOREIGN PATENT DOCUMENTS

| | | | | |
|---|---|---|---|---|
| CN | 113966069 | A | | 1/2022 |
| DE | 19734054 | A1 | | 2/1998 |
| DE | 102012216086 | A1 | | 3/2014 |
| DE | 102016224232 | A1 | | 1/2018 |
| EP | 0367630 | | * | 5/1990 |
| EP | 0367630 | A1 | | 5/1990 |

* cited by examiner

SUBSTRATE STRUCTURE AND TERMINAL DEVICE

CROSS-REFERENCE TO RELATED APPLICATIONS

This application is a continuation application of International Patent Application No. PCT/CN2022/099101, filed on Jun. 16, 2022, which claims priority to Chinese Patent Application No. 202111161406.4, filed on Sep. 30, 2021. The disclosures of the aforementioned applications are hereby incorporated by reference in their entireties.

TECHNICAL FIELD

This application relates to the field of chip cooling, and in particular, to a substrate structure and a terminal device.

BACKGROUND

In a conventional liquid cooling heat dissipation solution in a substrate, a liquid cooling pipeline is embedded in the substrate, a heat-generating chip is mounted upside down or directly mounted above the liquid cooling pipeline, and the chip is cooled by heat exchange through the liquid cooling pipeline. A heat-conducting working medium in the liquid cooling pipeline receives heat transferred from the chip, generates heat backflow, and evenly distributes the heat to the entire substrate.

In the substrate, the liquid cooling pipeline is in indirect contact with the chip, and the heat generated by the chip is transferred to the heat-conducting working medium of the liquid cooling pipeline in a heat conduction manner. Heat transfer efficiency of this manner is relatively low, and diffusion thermal resistance of the substrate is relatively large.

SUMMARY

This application provides a substrate structure that helps improve cooling efficiency of a chip. This application further provides a terminal device including the substrate structure.

A first aspect of embodiments of this application provides a substrate structure, including a frame body, a cooling housing, and a first chip. The frame body includes a first wall plate and a second wall plate that are disposed at a spacing. An accommodation cavity is formed between the first wall plate and the second wall plate. The cooling housing is at least partially disposed in the accommodation cavity, and is fastened to the frame body. A cooling cavity is formed between the cooling housing and the second wall plate. The first chip is disposed in the cooling cavity, is located in the accommodation cavity, and is connected to the second wall plate. The cooling cavity is configured to be filled by cooling fluid that immerses the first chip.

The first chip is mounted in the substrate structure in a form of chip embedding. That is, the first chip is located in the accommodation cavity between the first wall plate and the second wall plate. The first chip is located in both the accommodation cavity and the cooling cavity. The cooling housing in the frame body forms the cooling cavity for accommodating the cooling fluid. The cooling fluid may directly act on the first chip to quickly cool the first chip in an immersion cooling manner.

Based on the first aspect, in a possible implementation, the substrate structure further includes a first insulation part. The first insulation part is disposed on an end face that is of the first wall plate and that is away from the second wall plate, to form a first electrical connection region on a surface of the first wall plate.

In this possible implementation, an insulation region and the first electrical connection region are separated from the first wall plate by using the first insulation part. The first electrical connection region may be used for surface-mounting an inductor, a capacitor, and a resistor. The insulation region may effectively prevent the substrate structure from being affected by another electrical element, thereby ensuring normal operation of the substrate structure.

Based on the first aspect, in a possible implementation, the substrate structure further includes a second insulation part. The second insulation part is disposed on an end face that is of the second wall plate and that is away from the first wall plate, to form a second electrical connection region on a surface of the second wall plate.

In this possible implementation, an insulation region and the second electrical connection region are separated from the second wall plate by using the second insulation part. The second electrical connection region may be used for surface-mounting a printed circuit board (PCB). The insulation region may effectively prevent the substrate structure from being affected by another electrical element, thereby ensuring normal operation of the substrate structure.

Based on the first aspect, in a possible implementation, a buffer is filled between the first wall plate and the cooling housing in the accommodation cavity, and the buffer is configured to buffer an impact force between the first wall plate and the second wall plate.

In this possible implementation, the buffer may be an Ajinomoto Build-up Film (ABF) or polypropylene (PP). Strength of the substrate structure may be improved by filling the buffer into the accommodation cavity.

Based on the first aspect, in a possible implementation, the substrate structure further includes a copper clad laminate. The copper clad laminate is fastened to the frame body, the copper clad laminate is disposed between the second wall plate and the first chip, a surface that is of the copper clad laminate and that is away from the second wall plate forms a first wiring surface, and a surface that is of the copper clad laminate and that is close to the second wall plate forms a second wiring surface.

In this possible implementation, the copper clad laminate has specific strength, which may improve overall strength of the substrate structure. In addition, the copper clad laminate has the first wiring surface and the second wiring surface that are mutually insulated, which may increase a wiring area.

Based on the first aspect, in a possible implementation, the substrate structure further includes two cooling pipes. The cooling pipes include a first connection end and a second connection end that are connected. The first connection end is connected to the cooling cavity, and the second connection end is configured to connect a circulation apparatus that supplies the cooling fluid.

In this possible implementation, the two cooling pipes may be configured to connect two ports of the circulation apparatus, so that the cooling fluid in the cooling cavity may quickly circulate and convert, thereby improving cooling efficiency of the first chip.

Based on the first aspect, in a possible implementation, the substrate structure further includes a first resistor-capacitor-inductor element. The first resistor-capacitor-inductor element is disposed in the cooling cavity, and is connected to the second wall plate.

In this possible implementation, the first resistor-capacitor-inductor element may be a resistor, a capacitor, or an inductor. The first resistor-capacitor-inductor element is assembled to implement or extend a function of the substrate structure, and improve stability of the substrate structure.

Based on the first aspect, in a possible implementation, the substrate structure further includes a first insulation film and a second insulation film. The first insulation film covers a surface of the first chip, and the second insulation film covers a surface of the first resistor-capacitor-inductor element.

In this possible implementation, the first insulation film and the second insulation film increase a creepage interval between the first chip and the first resistor-capacitor-inductor element, and reduce a probability that the first resistor-capacitor-inductor element is electrically connected to the first chip in a high-voltage state.

Based on the first aspect, in a possible implementation, the substrate structure further includes a second chip. The cooling housing further includes an outer housing component and middleware. The cooling cavity is formed between the outer housing component and the second wall plate. The middleware is disposed in the cooling cavity, the middleware is relatively fastened to the outer housing component, and the second chip is connected to the middleware.

In this possible implementation, the cooling housing further extends the middleware. Layout space may be increased by using the middleware, so that the substrate structure may include the second chip, further extending a function of the substrate structure.

Based on the first aspect, in a possible implementation, the substrate structure further includes a second resistor-capacitor-inductor element. The second resistor-capacitor-inductor element is disposed in the cooling cavity, and is connected to the middleware.

In this possible implementation, the second resistor-capacitor-inductor element may be a resistor, a capacitor, or an inductor. The second resistor-capacitor-inductor element is assembled to implement or extend a function of the substrate structure, and improve stability of the substrate structure.

Based on the first aspect, in a possible implementation, the substrate structure further includes a plastic package. The plastic package covers a surface that is of the first wall plate and that is away from the second wall plate.

In this possible implementation, by packaging components such as the frame body, the plastic package may protect components such as the frame body of the substrate structure, so that the substrate structure may operate stably.

Based on the first aspect, in a possible implementation, a mounting opening is disposed on the first wall plate, and the cooling housing extends out of the accommodation cavity from the mounting opening. The plastic package covers the first wall plate and a surface that is of the cooling housing and that is away from the second wall plate.

In this possible implementation, when the cooling housing has a relatively large volume, the cooling housing extends out of the accommodation cavity, and the plastic package may cover both the frame body and the cooling housing, so that the plastic package may protect components such as the frame body and the cooling housing in the substrate structure.

Based on the first aspect, in a possible implementation, the substrate structure further includes a heat dissipation member. The heat dissipation member is disposed on a surface that is of the first wall plate and that is away from the second wall plate.

In this possible implementation, the heat dissipation member may quickly dissipate heat generated by the substrate structure.

Based on the first aspect, in a possible implementation, the first chip is connected to the second wall plate by using a plurality of first connectors, a first slot is formed between the plurality of first connectors, and the first slot is used for the cooling fluid to circulate.

In this possible implementation, the cooling fluid circulates through the first slot, to enhance heat dissipation of a surface that is of the first chip and that is close to the second wall plate.

A second aspect of embodiments of this application provides a terminal device, including a device body and the substrate structure provided in the first aspect. The substrate structure is disposed in the device body.

In the terminal device, the first chip may maintain a relatively low operating temperature by immersion cooling, so that the terminal device may operate stably for a long time.

REFERENCE NUMERALS

Figure 1:
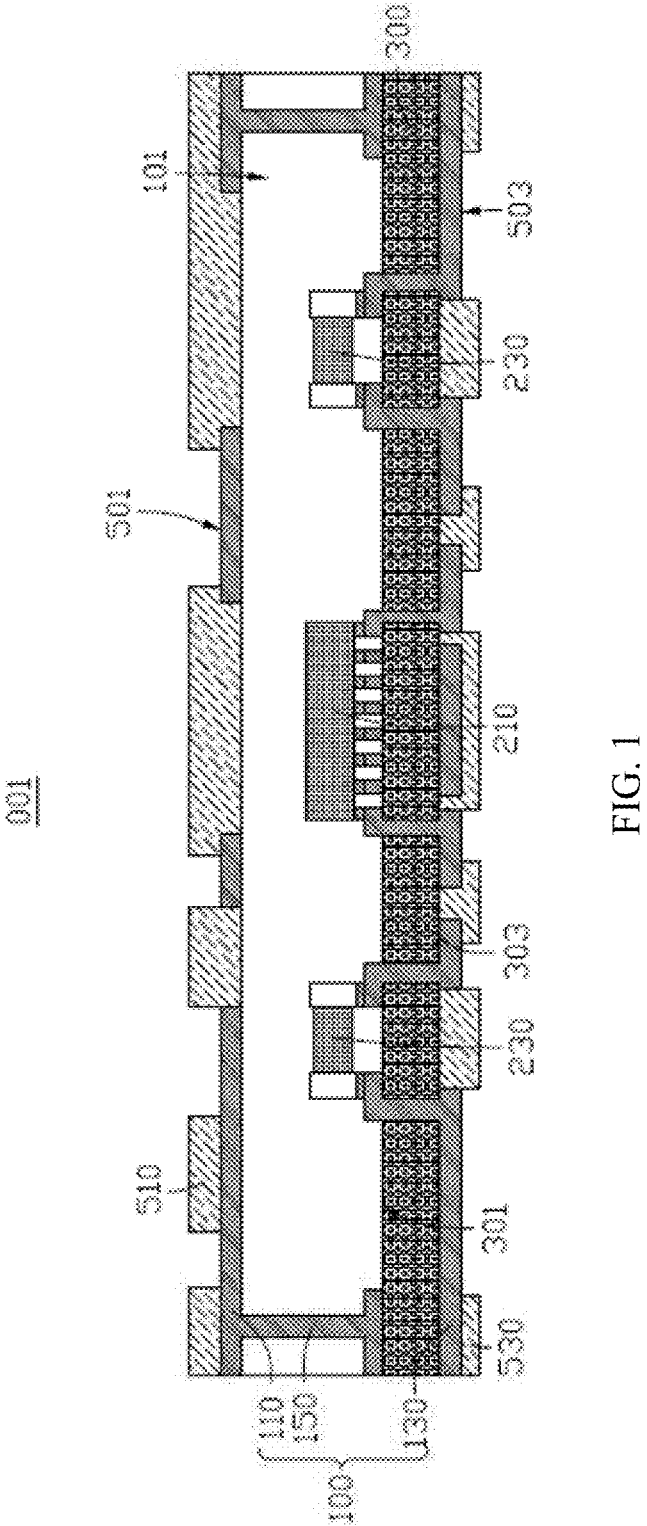
FIG. 1 is a schematic diagram of a structure of a substrate structure.

Substrate structure 001
Frame body 100
Accommodation cavity 101
Buffer cavity 101a
First wall plate 110
Second wall plate 130
First slot 131
Second slot 133
First extension part 135
Second extension part 137
Connecting plate 150
Buffer 170

First chip 210
First insulation film 211
First resistor-capacitor-inductor element 230
Second insulation film 231
Second chip 250
Second resistor-capacitor-inductor element 270
Copper clad laminate 300
First wiring surface 301
Second wiring surface 303
Cooling housing 400
Cooling cavity 401
Opening 403
Outer housing component 410
Middleware 430
Cooling fluid 450
Cooling pipe 470
First connection end 471
Second connection end 473
First electrical connection region 501
Second electrical connection region 503
First insulation part 510
Second insulation part 530
Plastic package 550
Heat dissipation member 600

In the following specific implementations, this application is further described with reference to the accompanying drawings.

DESCRIPTION OF EMBODIMENTS

The following describes implementations of this application by using specific embodiments. A person skilled in the art may easily learn of other advantages and effects of this application based on content disclosed in this specification. Although this application is described with reference to an example embodiment, it does not mean that a characteristic of this application is limited only to this implementation. On the contrary, a purpose of describing this application with reference to an implementation is to cover another option or modification that may be derived based on claims of this application. To provide an in-depth understanding of this application, the following descriptions include a plurality of specific details. This application may be alternatively implemented without using these details. In addition, to avoid confusion or blurring a focus of this application, some specific details are omitted from the description. It should be noted that embodiments in this application and the features in embodiments may be mutually combined in the case of no conflict.

The following terms "first", "second", and the like are merely used for description, and shall not be understood as an indication or implication of relative importance or implicit indication of a quantity of indicated technical features. Therefore, a feature limited by "first", "second" and the like may explicitly indicate or implicitly include one or more such features. In the descriptions of this application, unless otherwise stated, "a plurality of" means two or more than two. Orientation terms such as "up", "down", "left", and "right" are defined relative to an orientation of schematic placement of components in the accompanying drawings. It should be understood that these directional terms are relative concepts and are used for relative description and clarification. These directional terms may vary accordingly depending on an orientation in which the components are placed in the accompanying drawings.

In this application, unless otherwise explicitly specified and limited, a term "connection" should be understood in a broad sense. For example, the "connection" may be a fastened connection, a detachable connection, or an integrated connection; and may be a direct connection or an indirect connection by using an intermediate medium. The term "and/or" used in this specification includes any and all combinations of one or more related listed items.

When the following embodiments are described in detail with reference to schematic diagrams, for ease of description, a diagram indicating a partial structure of a component is partially enlarged not based on a general scale. In addition, the schematic diagrams are merely examples, and should not limit the protection scope of this application herein.

To make the objectives, technical solutions, and advantages of this application clearer, the following further describes the implementations of this application in detail with reference to the accompanying drawings.

FIG. 1 is a schematic diagram of a structure of a substrate structure 001.

As shown in FIG. 1, the substrate structure 001 includes a frame body 100, a first chip 210, and a first resistor-capacitor-inductor element 230. The frame body 100 is made of a conductor material, and includes a first wall plate 110 and a second wall plate 130 that are opposite to each other. The first wall plate 110 and the second wall plate 130 are connected by using a connecting plate 150, and an accommodation cavity 101 is formed between the first wall plate 110 and the second wall plate 130. The first chip 210 is disposed in the accommodation cavity 101, and is electrically connected to the second wall plate 130. The first resistor-capacitor-inductor element 230 is also disposed in the accommodation cavity 101, and is electrically connected to the second wall plate 130. The first resistor-capacitor-inductor element 230 may be a resistor, a capacitor, or an inductor. The first resistor-capacitor-inductor element 230 and the first chip 210 are disposed at a spacing, to reduce a probability that the first resistor-capacitor-inductor element 230 and the cell affect each other.

It may be understood that the first wall plate 110, the second wall plate 130, and the connecting plate 150 in the frame body 100 may be made as a whole without using a conductor material. Instead, conductive lines are disposed on the first wall plate 110, the second wall plate 130, and the connecting plate 150, and the conductive lines of the first wall plate 110, the second wall plate 130, and the connecting plate 150 are electrically connected.

The substrate structure 001 further includes a copper clad laminate 300, and the copper clad laminate 300 is disposed at a position close to the second wall plate 130 in the accommodation cavity 101. The copper clad laminate 300 is located between the first chip 210 and the second wall plate 130. The second wall plate 130 includes a first extension part 135, and the first extension part 135 passes through the copper clad laminate 300 to a position of the first chip 210. The first chip 210 is electrically connected to the corresponding first extension part 135, to implement an electrical connection between the first chip 210 and the second wall plate 130. The first resistor-capacitor-inductor element 230 is electrically connected to the corresponding first extension part 135, to implement an electrical connection between the first resistor-capacitor-inductor element 230 and the second wall plate 130. A surface that is of the copper clad laminate 300 and that is away from the second wall plate 130 forms a first wiring surface 301, and a surface that is of the copper clad laminate 300 and that is close to the second wall plate 130 forms a second wiring surface 303. The first wiring surface 301 and the second wiring surface 303 may be separately wired, and a wiring area of the substrate structure 001 is increased by using the copper clad laminate 300. In addition, the copper clad laminate 300 has specific strength, and strength of the substrate structure 001 may be increased by disposing the copper clad laminate 300.

In the substrate structure 001, the first chip 210 is located in the accommodation cavity 101 between the first wall plate 110 and the second wall plate 130, to form an embedded substrate structure. The first chip 210 is packaged in the frame body 100, so that integration and power density may be improved, and an overall size of the substrate structure 001 may be reduced. The substrate structure 001 may implement heat dissipation by connecting the frame body 100 to an external heat dissipation structure.

Figure 2:
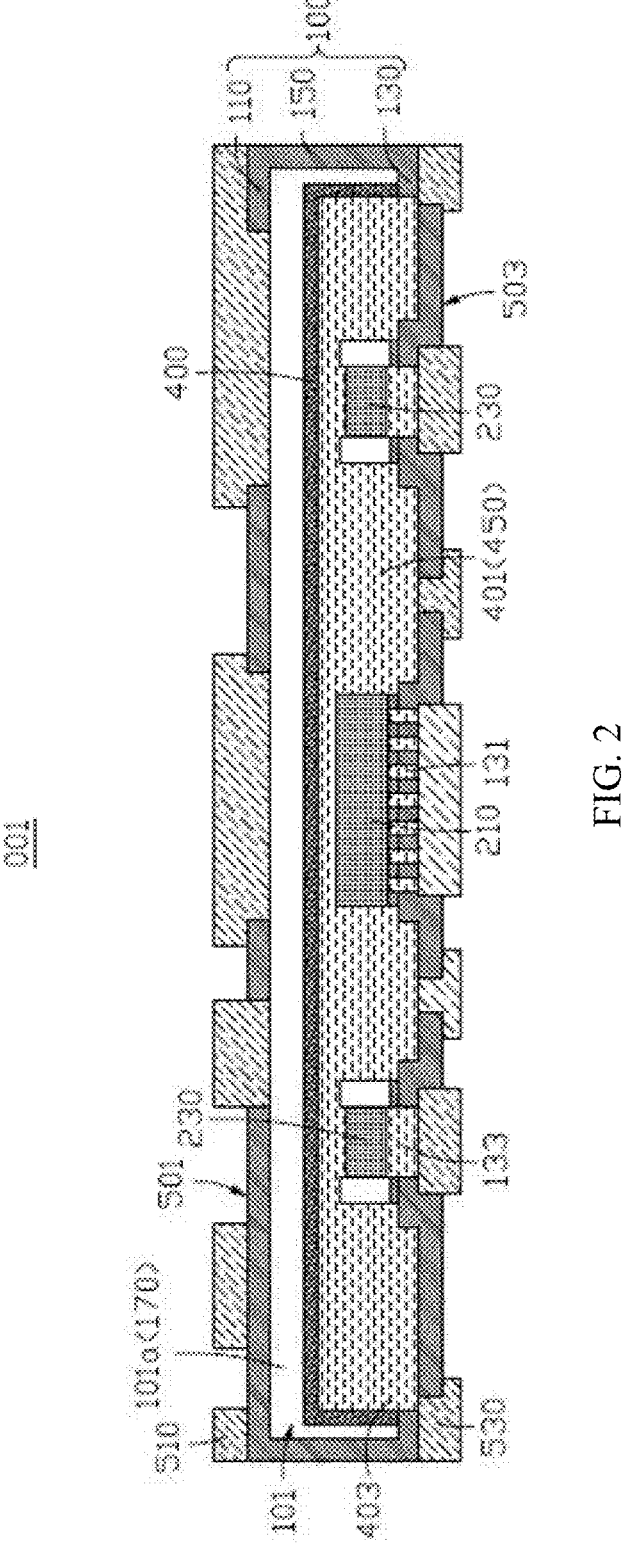
FIG. 2 is a schematic diagram of a structure of a substrate structure according to an embodiment of this application.

FIG. 2 is a schematic diagram of a structure of a substrate structure 001 according to an implementation of this application.

As shown in FIG. 2, the substrate structure 001 includes a frame body 100, a cooling housing 400, a first chip 210, and a first resistor-capacitor-inductor element 230.

The frame body 100 is made of a conductor material. Optionally, the frame body 100 is made of copper, and has a relatively strong conductive property. The frame body 100 includes a first wall plate 110, a second wall plate 130, and a connecting plate 150. The first wall plate 110 and the second wall plate 130 are approximately parallel and disposed at a spacing. The first wall plate 110 is connected to the second wall plate 130 by using the connecting plate 150, so that the first wall plate 110 is electrically connected to the second wall plate 130. The first wall plate 110 and the second wall plate 130 may be separately wired, so that each element may implement a function thereof after each element in the substrate structure 001 is electrically connected to the first wall plate 110 or the second wall plate 130.

An accommodation cavity 101 is formed between the first wall plate 110 and the second wall plate 130, and the first chip 210 and the first resistor-capacitor-inductor element 230 are disposed in the accommodation cavity 101. The first chip 210 is fastened to the second wall plate 130, and the first chip 210 is electrically connected to the second wall plate 130. The first resistor-capacitor-inductor element 230 is fastened to the second wall plate 130, and the first resistor-capacitor-inductor element 230 is electrically connected to the second wall plate 130. The first resistor-capacitor-inductor element 230 may be a resistor, a capacitor, or an inductor. A corresponding element is selected as the first resistor-capacitor-inductor element 230 according to an actual requirement of the substrate structure 001, so that each element in the substrate structure 001 is electrically connected to implement a required function.

The cooling housing 400 is located in the accommodation cavity 101. One end of the cooling housing 400 has an opening 403, and one end of the opening 403 is connected to the second wall plate 130 in a sealed manner. The cooling housing 400 and the second wall plate 130 jointly form a cooling cavity 401. The first chip 210 and the first resistor-capacitor-inductor element 230 are located in the cooling cavity 401, and the first chip 210 and the first resistor-capacitor-inductor element 230 are not in direct contact with the cooling housing 400. The cooling cavity 401 is filled with cooling fluid 450, and the cooling fluid 450 immerses the first chip 210 and the first resistor-capacitor-inductor element 230. When the first chip 210 and the first resistor-capacitor-inductor element 230 generate heat during operation, the cooling fluid 450 may quickly take the heat away from the first chip 210 and the first resistor-capacitor-inductor element 230. Optionally, the cooling housing 400 is made of metal, ceramic, or plastic, so that the cooling housing 400 has specific strength, and may maintain a shape of the cooling housing 400 when the substrate structure 001 operates.

The cooling fluid 450 is insulation and heat-conducting fluid, and an insulation characteristic of the cooling fluid 450 may maintain normal operation of the first chip 210 and the first resistor-capacitor-inductor element 230. Optionally, the cooling fluid 450 is transformer oil or fluoride liquid, has a relatively good thermal conductivity, and may immerse in a narrow slot of a chip or a resistor-capacitor-inductor element and take away heat at the slot, thereby achieving a better cooling effect.

The first chip 210 and the second wall plate 130 are connected by using a plurality of spaced first connectors, and a first slot 131 is further provided between two adjacent first connectors. When the cooling fluid 450 passes through the first slot 131, heat of one end that is of the first chip 210 and that is close to the second wall plate 130 may be quickly taken away from the first chip 210, thereby improving a heat dissipation effect of the first chip 210.

The first resistor-capacitor-inductor element 230 is connected to the second wall plate 130 by using two second connectors, and a second slot 133 exists between the two second connectors. When the cooling fluid 450 passes through the second slot 133, heat of one end that is of the first resistor-capacitor-inductor element 230 and that is close to the second wall plate 130 may be quickly taken away from the first resistor-capacitor-inductor element 230, thereby improving a heat dissipation effect of the first resistor-capacitor-inductor element 230.

In the accommodation cavity 101, a buffer cavity 101a is formed between the first wall plate 110, the connecting plate 150, and the cooling housing 400, and the buffer cavity 101a is filled with a buffer 170. Optionally, the buffer 170 is an ABF or PP. An impact force transfer between the first wall plate 110 and the second wall plate 130 may be buffered by filling the accommodation cavity 101 with the buffer 170, thereby improving strength of the substrate structure 001.

The substrate structure 001 further includes a first insulation part 510 and a second insulation part 530.

The first insulation part 510 is disposed on an end face that is of the first wall plate 110 and that is away from the second wall plate 130. The first insulation part 510 may be formed on a surface of the first wall plate 110 in a form of photoelectric chemical etching or the like. While protecting the first wall plate 110, the first insulation part 510 forms a first electrical connection region 501 at a position at which the first insulation part 510 is not disposed on the first wall plate 110. A capacitor, a resistor, or an inductor may be electrically connected in the first electrical connection region 501, to extend a function of the substrate structure 001. An insulation region in which the first insulation part 510 is located may effectively prevent the substrate structure 001 from being affected by another electrical element, thereby ensuring normal operation of the substrate structure 001.

The second insulation part 530 is disposed on an end face that is of the second wall plate 130 and that is away from the first wall plate 110. The second insulation part 530 may be formed on a surface of the second wall plate 130 in a form of photoelectric chemical etching or the like. While protecting the second wall plate 130, the second insulation part 530 forms a second electrical connection region 503 at a position at which the second insulation part 530 is not disposed on the second wall plate 130. The second electrical connection region 503 may be configured to connect the substrate structure 001 to a PCB, to facilitate application of the substrate structure 001. An insulation region in which the second insulation part 530 is located may effectively prevent the substrate structure 001 from being affected by another electrical element, thereby ensuring normal operation of the substrate structure 001.

The substrate structure 001 may implement quick heat dissipation of the first chip 210 and the first resistor-capacitor-inductor element 230 by filling the cooling cavity 401 with the cooling fluid 450, to maintain normal operation of the substrate structure 001. The cooling fluid 450 circulating in the first slot 131 between the first chip 210 and the second wall plate 130 may further enhance heat dissipation of the first chip 210.

Figure 3:
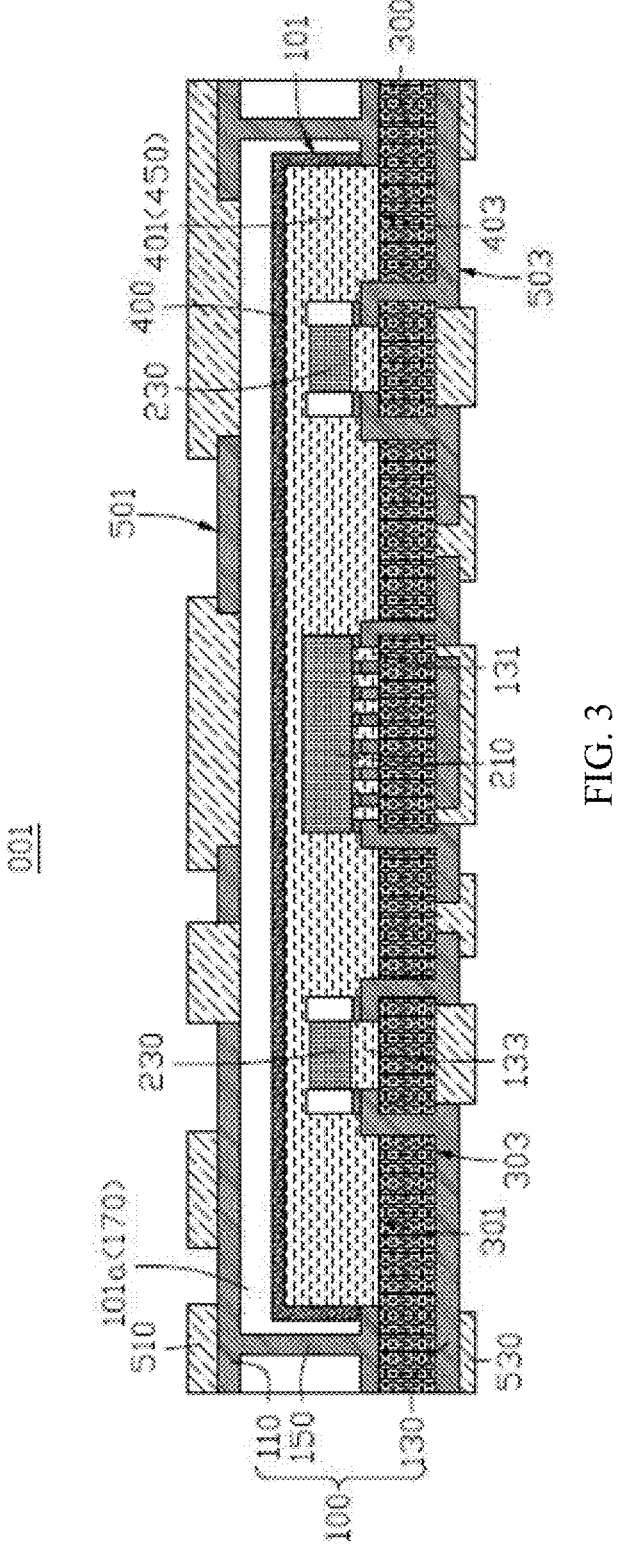
FIG. 3 is a schematic diagram of a structure of a substrate structure according to an embodiment of this application.

FIG. 3 is a schematic diagram of a structure of a substrate structure 001 according to an implementation of this application.

As shown in FIG. 3, the substrate structure 001 includes a frame body 100, a cooling housing 400, a copper clad laminate 300, a first chip 210, and a first resistor-capacitor-inductor element 230.

The frame body 100 is made of a conductor material. Optionally, the frame body 100 is made of copper, and has a relatively strong conductive property. The frame body 100 includes a first wall plate 110, a second wall plate 130, and a connecting plate 150. The first wall plate 110 and the second wall plate 130 are approximately parallel and disposed at a spacing. The first wall plate 110 is connected to the second wall plate 130 by using the connecting plate 150, so that the first wall plate 110 is electrically connected to the second wall plate 130. The first wall plate 110 and the second wall plate 130 may be separately wired, so that each element may implement a function thereof after each element in the substrate structure 001 is electrically connected to the first wall plate 110 or the second wall plate 130.

The copper clad laminate 300 is disposed on a surface that is of the second wall plate 130 and that is close to the first wall plate 110, and the copper clad laminate 300 is relatively fastened to the second wall plate 130. Because the copper clad laminate 300 has specific strength, the substrate structure 001 may have higher strength after the copper clad laminate 300 is relatively fastened to the second wall plate 130. When the substrate structure 001 has a tendency to bend due to an external force, the copper clad laminate 300 may reduce a bending degree of the substrate structure 001.

An accommodation cavity 101 is formed between the first wall plate 110 and the second wall plate 130. The first chip 210 and the first resistor-capacitor-inductor element 230 are disposed in the accommodation cavity 101, and are located on a surface that is of the copper clad laminate 300 and that is away from the second wall plate 130. The second wall plate 130 includes a first extension part 135, and the first extension part 135 passes through the copper clad laminate 300. The first extension part 135 corresponding to the first chip 210 is electrically connected to a plurality of spaced first connectors at one end close to the chip. The first connectors are electrically connected to the first chip 210, and a first slot 131 is provided between two adjacent first connectors. The first chip 210 is connected to the first connectors, that is, implementing an electrical connection between the first chip 210 and the second wall plate 130.

The first extension part 135 corresponding to the first resistor-capacitor-inductor element 230 is electrically connected to two second connectors at one end close to the first resistor-capacitor-inductor element 230. The second connectors are electrically connected to the first resistor-capacitor-inductor element 230, and a second slot 133 is provided between the two second connectors. The first resistor-capacitor-inductor element 230 is connected to the second connectors, that is, implementing an electrical connection between the first resistor-capacitor-inductor element 230 and the second wall plate 130. The first resistor-capacitor-inductor element 230 may be a resistor, a capacitor, or an inductor. A corresponding element is selected as the first resistor-capacitor-inductor element 230 according to an actual requirement of the substrate structure 001, so that each element in the substrate structure 001 is electrically connected to implement a required function.

The cooling housing 400 is located in the accommodation cavity 101. One end of the cooling housing 400 has an opening 403, and one end of the opening 403 is connected to the second wall plate 130 in a sealed manner. The cooling housing 400, the second wall plate 130, and the copper clad laminate 300 jointly form a cooling cavity 401. The cooling cavity 401 is located between the cooling housing 400 and the second wall plate 130. The first chip 210 and the first resistor-capacitor-inductor element 230 are located in the cooling cavity 401, and the first chip 210 and the first resistor-capacitor-inductor element 230 are not in direct contact with the cooling housing 400. The cooling cavity 401 is filled with cooling fluid 450, and the cooling fluid 450 immerses the first chip 210 and the first resistor-capacitor-inductor element 230. When the first chip 210 and the first resistor-capacitor-inductor element 230 generate heat during operation, the cooling fluid 450 may quickly take the heat away from the first chip 210 and the first resistor-capacitor-inductor element 230.

The cooling fluid 450 may further flow through the first slot 131, to take away heat of one end that is of the first chip 210 and that is close to the copper clad laminate 300. Similarly, the cooling fluid 450 may further flow through the second slot 133, to take away heat of one end that is of the first resistor-capacitor-inductor element 230 and that is close to the copper clad laminate 300.

The cooling fluid 450 is insulation and heat-conducting fluid, and an insulation characteristic of the cooling fluid 450 may maintain normal operation of the first chip 210 and the first resistor-capacitor-inductor element 230. Optionally, the cooling fluid 450 is transformer oil or fluoride liquid, has a relatively good thermal conductivity, and may immerse in a narrow slot of a chip or a resistor-capacitor-inductor element and take away heat at the slot, thereby achieving a better cooling effect.

In the accommodation cavity 101, a buffer cavity 101a is formed between the first wall plate 110, the connecting plate 150, and the cooling housing 400, and the buffer cavity 101a is filled with a buffer 170. Optionally, the buffer 170 is an ABF or PP. An impact force transfer between the first wall plate 110 and the second wall plate 130 may be buffered by filling the accommodation cavity 101 with the buffer 170, thereby improving strength of the substrate structure 001.

The substrate structure 001 further includes a first insulation part 510 and a second insulation part 530.

The first insulation part 510 is disposed on an end face that is of the first wall plate 110 and that is away from the second wall plate 130. The first insulation part 510 may be formed on a surface of the first wall plate 110 in a form of photoelectric chemical etching or the like. While protecting the first wall plate 110, the first insulation part 510 forms a first electrical connection region 501 at a position at which the first insulation part 510 is not disposed on the first wall plate 110. A capacitor, a resistor, or an inductor may be electrically connected in the first electrical connection region 501, to extend a function of the substrate structure 001. An insulation region in which the first insulation part 510 is located may effectively prevent the substrate structure 001 from being affected by another electrical element, thereby ensuring normal operation of the substrate structure 001.

The second insulation part 530 is disposed on an end face that is of the second wall plate 130 and that is away from the first wall plate 110. The second insulation part 530 may be formed on a surface of the second wall plate 130 in a form of photoelectric chemical etching or the like. While protecting the second wall plate 130, the second insulation part 530 forms a second electrical connection region 503 at a position at which the second insulation part 530 is not disposed on the second wall plate 130. The second electrical connection region 503 may be configured to connect the substrate structure 001 to a PCB, to facilitate application of the substrate structure 001. An insulation region in which the second insulation part 530 is located may effectively prevent the substrate structure 001 from being affected by another electrical element, thereby ensuring normal operation of the substrate structure 001.

The substrate structure 001 may implement quick heat dissipation of the first chip 210 and the first resistor-capacitor-inductor element 230 by filling the cooling cavity 401 with the cooling fluid 450, to maintain normal operation of the substrate structure 001. The cooling fluid 450 circulating in the first slot 131 between the first chip 210 and the second wall plate 130 may further enhance heat dissipation of the first chip 210.

Figure 4:
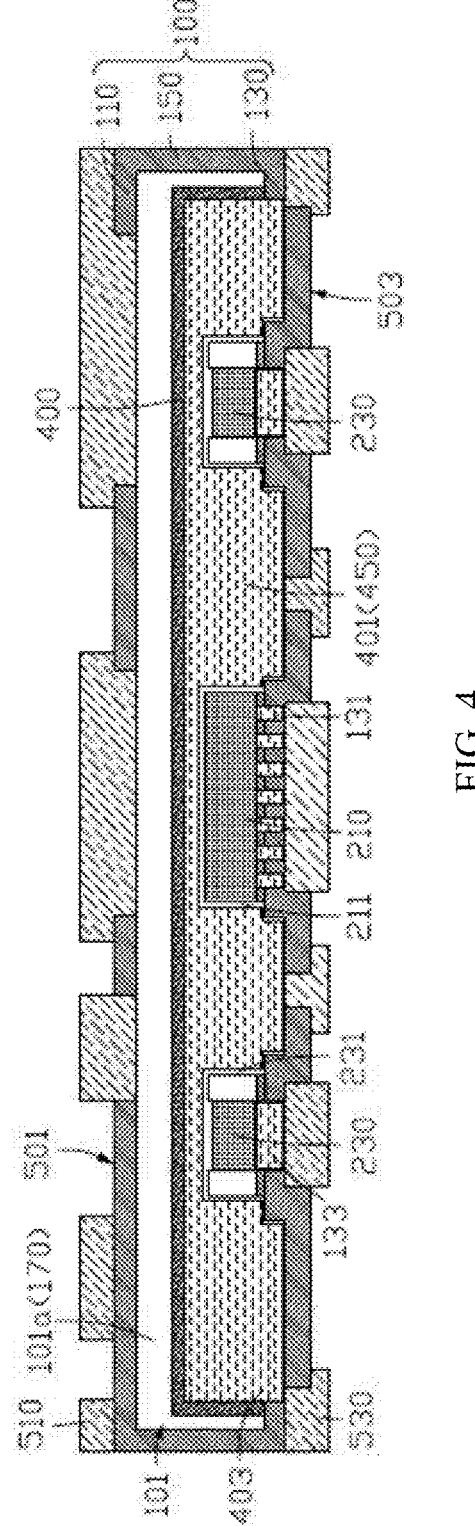
FIG. 4 is a schematic diagram of a structure of a substrate structure according to an embodiment of this application.

FIG. 4 is a schematic diagram of a structure of a substrate structure 001 according to an implementation of this application.

Based on the substrate structure 001 shown in FIG. 2, the substrate structure 001 further includes a first insulation film 211 and a second insulation film 231.

The first insulation film 211 covers a surface of the first chip 210, so that insulation performance of the first chip 210 may be improved. The second insulation film 231 covers a surface of the first resistor-capacitor-inductor element 230, so that insulation performance of the first resistor-capacitor-inductor element 230 may be improved.

A creepage slot between the first chip 210 and the first resistor-capacitor-inductor element 230 may be increased by using the first insulation film 211 and the second insulation film 231. The first chip 210 and the first resistor-capacitor-inductor element 230 may not be directly conducted even if both the first chip 210 and the first resistor-capacitor-inductor element 230 operate at a relatively high voltage, thereby effectively ensuring stable operation of the substrate structure 001.

Figure 5:
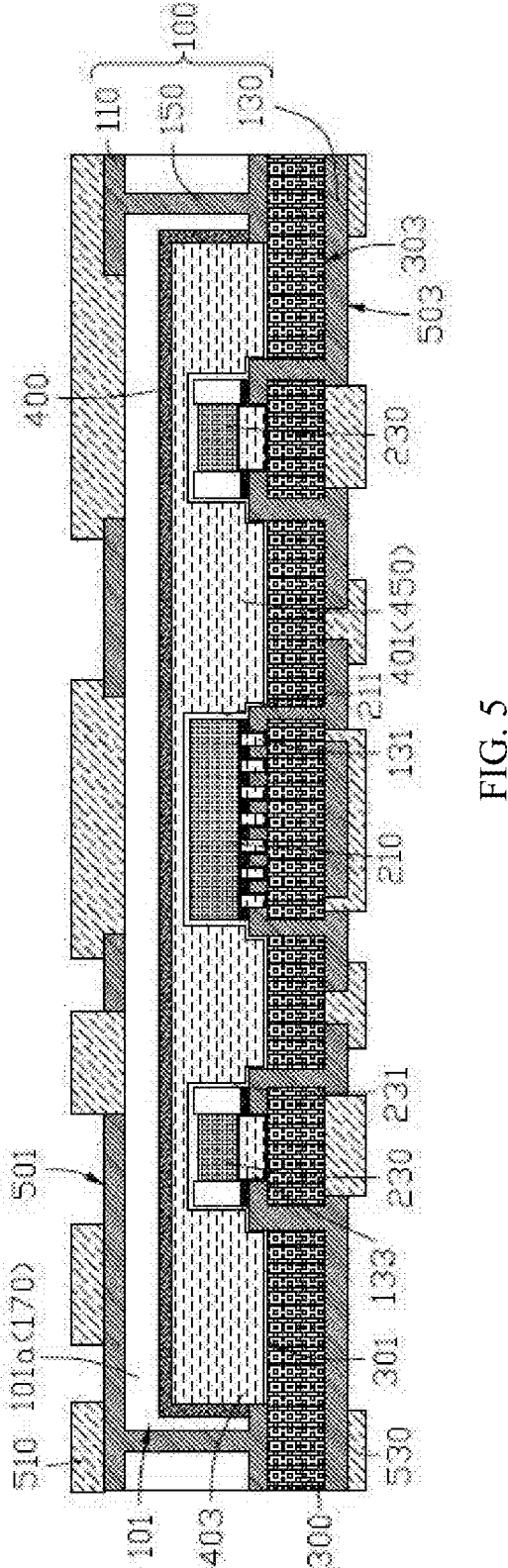
FIG. 5 is a schematic diagram of a structure of a substrate structure according to an embodiment of this application.

FIG. 5 is a schematic diagram of a structure of a substrate structure 001 according to an implementation of this application.

Based on the substrate structure 001 shown in FIG. 3, the substrate structure 001 further includes a first insulation film 211 and a second insulation film 231.

The first insulation film 211 covers a surface of the first chip 210, so that insulation performance of the first chip 210 may be improved. The second insulation film 231 covers a surface of the first resistor-capacitor-inductor element 230, so that insulation performance of the first resistor-capacitor-inductor element 230 may be improved.

Optionally, the first insulation film 211 and the second insulation film 231 are polyimide (PI) films, have better insulation performance, and may be thin enough.

A creepage slot between the first chip 210 and the first resistor-capacitor-inductor element 230 may be increased by using the first insulation film 211 and the second insulation film 231. The first chip 210 and the first resistor-capacitor-inductor element 230 may not be directly conducted even if both the first chip 210 and the first resistor-capacitor-inductor element 230 operate at a relatively high voltage, thereby effectively ensuring stable operation of the substrate structure 001.

Figure 6:
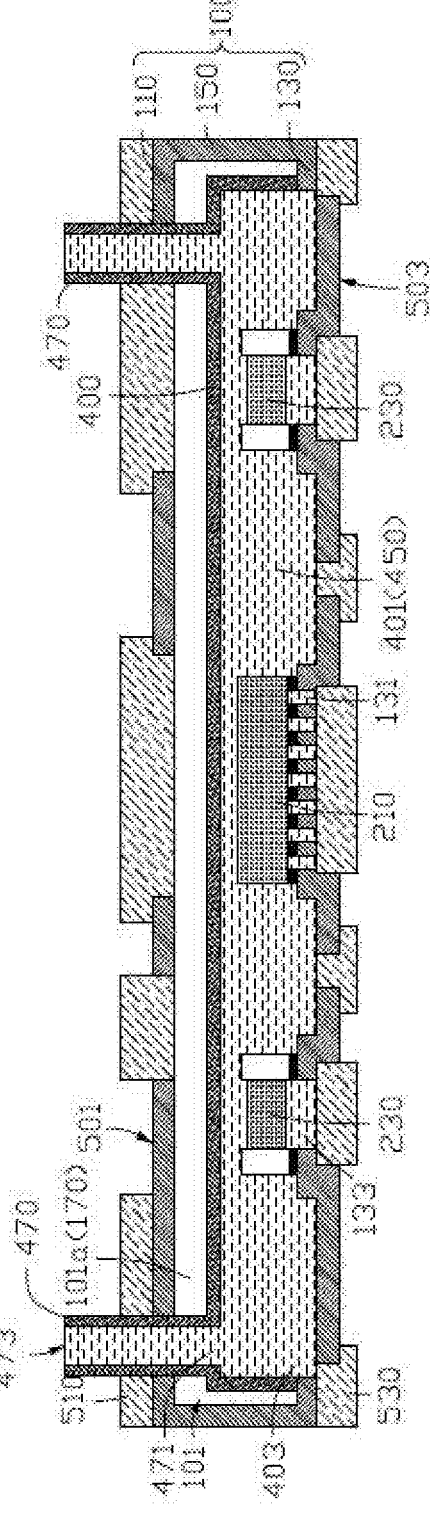
FIG. 6 is a schematic diagram of a structure of a substrate structure according to an embodiment of this application.

FIG. 6 is a schematic diagram of a structure of a substrate structure 001 according to an implementation of this application.

Based on the substrate structure 001 shown in FIG. 2, the substrate structure 001 further includes two cooling pipes 470. The two cooling pipes 470 are located on two opposite sides of the cooling housing 400.

The cooling pipes 470 include a first connection end 471 and a second connection end 473 that are opposite to each other, and the first connection end 471 is directly connected to the second connection end 473.

The first connection end 471 is connected to the cooling cavity 401 in the accommodation cavity 101, so that the cooling fluid 450 in the cooling cavity 401 may enter the cooling pipes 470, and the cooling fluid 450 may also be provided for the cooling cavity 401 by using the cooling pipes 470.

The second connection end 473 extends out of the accommodation cavity 101, and is configured to connect a circulation apparatus (not shown in the figure).

The circulation apparatus includes a circulation pump, a pump outlet, and a pump inlet, and provides power for the cooling fluid through the circulation pump, so that the cooling fluid may enter from the pump inlet and then flow out from the pump outlet at a specific speed. One of the two cooling pipes 470 serves as a first pipe, and the other serves as a second pipe. The second connection end 473 of the first pipe is connected to the pump inlet, and the second connection end 473 of the second pipe is connected to the pump outlet. When the circulation apparatus is started, the first pipe leads out the cooling fluid 450 in the cooling cavity 401. The cooling fluid 450 flows through the circulation pump, and then flows out from the pump outlet. The cooling fluid 450 flowing out from the pump outlet enters the cooling cavity 401 through the second pipe, to implement circulation of the cooling fluid 450.

An active cooling structure may further be disposed in the circulation apparatus, and the cooling fluid 450 flowing through the circulation apparatus is cooled by using the active cooling structure.

The cooling fluid 450 in the substrate structure 001 may have strong fluidity, and may provide a better heat dissipation effect for the first chip 210 and the first resistor-capacitor-inductor element 230.

Figure 7:
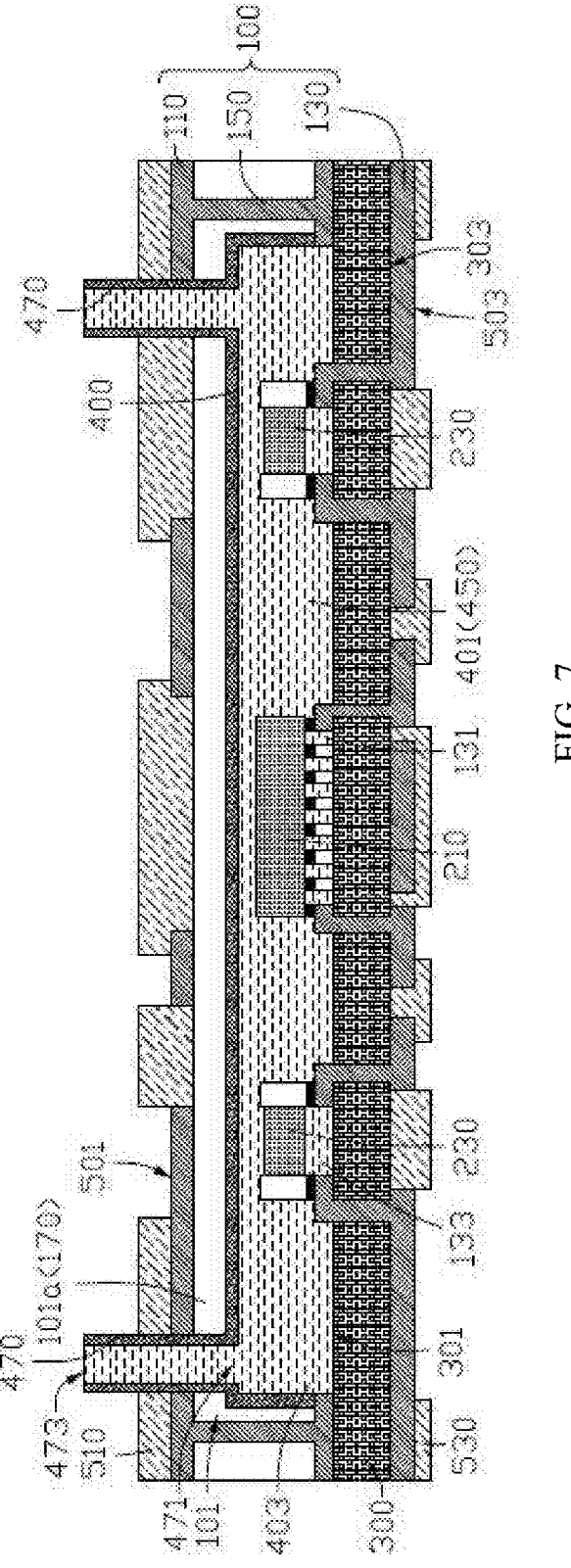
FIG. 7 is a schematic diagram of a structure of a substrate structure according to an embodiment of this application.

FIG. 7 is a schematic diagram of a structure of a substrate structure 001 according to an implementation of this application.

Based on the substrate structure 001 shown in FIG. 3, the substrate structure 001 further includes two cooling pipes 470. The two cooling pipes 470 are located on two opposite sides of the cooling housing 400.

The cooling pipes 470 include a first connection end 471 and a second connection end 473 that are opposite to each other, and the first connection end 471 is directly connected to the second connection end 473.

The first connection end 471 is connected to the cooling cavity 401 in the accommodation cavity 101, so that the cooling fluid 450 in the cooling cavity 401 may enter the cooling pipes 470, and the cooling fluid 450 may also be provided for the cooling cavity 401 by using the cooling pipes 470.

The second connection end 473 extends out of the accommodation cavity 101, and is configured to connect a circulation apparatus (not shown in the figure).

The circulation apparatus includes a circulation pump, a pump outlet, and a pump inlet, and provides power for the cooling fluid through the circulation pump, so that the fluid may enter from the pump inlet and then flow out from the pump outlet at a specific speed. One of the two cooling pipes 470 serves as a first pipe, and the other serves as a second pipe. The second connection end 473 of the first pipe is connected to the pump inlet, and the second connection end 473 of the second pipe is connected to the pump outlet. When the circulation apparatus is started, the first pipe leads out the cooling fluid 450 in the cooling cavity 401. The cooling fluid 450 flows through the circulation pump, and then flows out from the pump outlet. The cooling fluid 450 flowing out from the pump outlet enters the cooling cavity 401 through the second pipe, to implement circulation of the cooling fluid 450.

An active cooling structure may further be disposed in the circulation apparatus, and the cooling fluid 450 flowing through the circulation apparatus is cooled by using the active cooling structure.

The cooling fluid 450 in the substrate structure 001 may have strong fluidity, and may provide a better heat dissipation effect for the first chip 210 and the first resistor-capacitor-inductor element 230.

Figure 8:
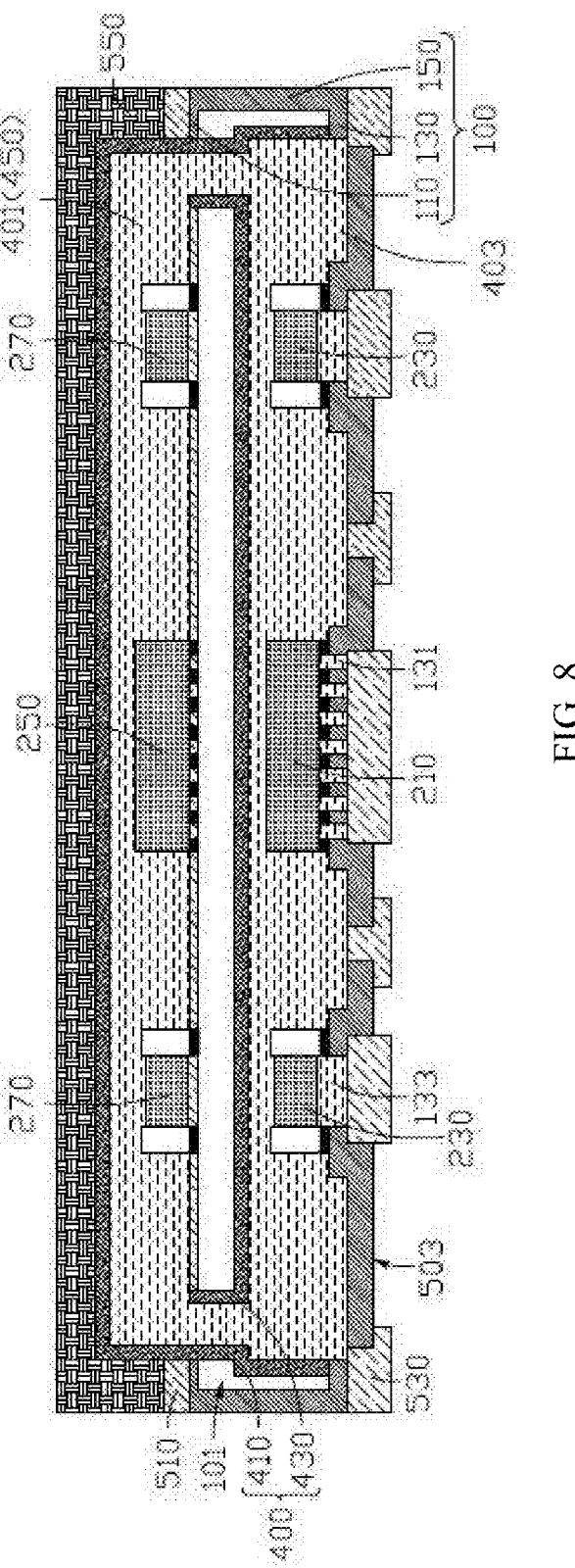
FIG. 8 is a schematic diagram of a structure of a substrate structure according to an embodiment of this application.

FIG. 8 is a schematic diagram of a structure of a substrate structure 001 according to an implementation of this application.

As shown in FIG. 8, the substrate structure 001 includes a frame body 100, a cooling housing 400, a first chip 210, and a first resistor-capacitor-inductor element 230.

The frame body 100 is made of a conductor material. Optionally, the frame body 100 is made of copper, and has a relatively strong conductive property. The frame body 100 includes a first wall plate 110, a second wall plate 130, and a connecting plate 150. The first wall plate 110 and the second wall plate 130 are approximately parallel and disposed at a spacing. The first wall plate 110 is connected to the second wall plate 130 by using the connecting plate 150, so that the first wall plate 110 is electrically connected to the second wall plate 130. The first wall plate 110 and the second wall plate 130 may be separately wired, so that each element may implement a function thereof after each element in the substrate structure 001 is electrically connected to the first wall plate 110 or the second wall plate 130.

It may be understood that the first wall plate 110 may not need to be separately wired if the first wall plate 110 does not need to be mounted with a resistor-capacitor-inductor element.

An accommodation cavity 101 is formed between the first wall plate 110 and the second wall plate 130. A mounting opening is disposed on the first wall plate 110. A part of the cooling housing 400 is located in the accommodation cavity 101, and the other part of the cooling housing 400 extends out of the accommodation cavity 101 from the mounting opening. The cooling housing 400 includes an outer housing component 410 and middleware 430, and the middleware 430 is located in the outer housing component 410. One end of the outer housing component 410 has an opening 403, and one end of the opening 403 is connected to the second wall plate 130 in a sealed manner. The outer housing component 410 and the second wall plate 130 jointly form a cooling cavity 401. The first chip 210 and the first resistor-capacitor-inductor element 230 are located in the cooling cavity 401, and the first chip 210 and the first resistor-capacitor-inductor element 230 are not in direct contact with the cooling housing 400. The cooling cavity 401 is filled with cooling fluid 450, and the cooling fluid 450 immerses the first chip 210 and the first resistor-capacitor-inductor element 230. When the first chip 210 and the first resistor-capacitor-inductor element 230 generate heat during operation, the cooling fluid 450 may quickly take the heat away from the first chip 210 and the first resistor-capacitor-inductor element 230. Optionally, the cooling housing 400 is made of metal, ceramic, or plastic, so that the cooling housing 400 has specific strength, and may maintain a shape of the cooling housing 400 when the substrate structure 001 operates.

The first chip 210 is fastened to the second wall plate 130, and the first chip 210 is electrically connected to the second wall plate 130. The first resistor-capacitor-inductor element 230 is fastened to the second wall plate 130, and the first resistor-capacitor-inductor element 230 is electrically connected to the second wall plate 130. The first resistor-capacitor-inductor element 230 may be a resistor, a capacitor, or an inductor. A corresponding element is selected as the first resistor-capacitor-inductor element 230 according to an actual requirement of the substrate structure 001, so that each element in the substrate structure 001 is electrically connected to implement a required function.

The cooling fluid 450 is insulation and heat-conducting fluid, and an insulation characteristic of the cooling fluid 450 may maintain normal operation of the first chip 210 and the first resistor-capacitor-inductor element 230. Optionally, the cooling fluid 450 is transformer oil or fluoride liquid, has a relatively good thermal conductivity, and may immerse in a narrow slot of a chip or a resistor-capacitor-inductor element and take away heat at the slot, thereby achieving a better cooling effect.

The first chip 210 and the second wall plate 130 are connected by using a plurality of spaced first connectors, and a first slot 131 is further provided between two adjacent first connectors. When the cooling fluid 450 passes through the first slot 131, heat of one end that is of the first chip 210 and that is close to the second wall plate 130 may be quickly taken away from the first chip 210, thereby improving a heat dissipation effect of the first chip 210.

The first resistor-capacitor-inductor element 230 is connected to the second wall plate 130 by using two second connectors, and a second slot 133 exists between the two second connectors. When the cooling fluid 450 passes through the second slot 133, heat of one end that is of the first resistor-capacitor-inductor element 230 and that is close to the second wall plate 130 may be quickly taken away from the first resistor-capacitor-inductor element 230, thereby improving a heat dissipation effect of the first resistor-capacitor-inductor element 230.

The substrate structure 001 further includes a second chip 250 and a second resistor-capacitor-inductor element 270.

The middleware 430 is located at an end that is of the first chip 210 and that is away from the second wall plate 130, and the middleware 430 and the first chip 210 are disposed at a spacing. The middleware 430 is relatively fastened to the outer housing component 410.

The second chip 250 is disposed on the middleware 430. The second wall plate 130 includes a second extension part 137, and the second extension part 137 passes through the middleware 430. While the second chip 250 is connected to the middleware 430, the second chip 250 is electrically connected to the corresponding second extension part 137. The middleware 430 may support a relative position of the second chip 250, and the second extension part 137 enables the second chip 250 to be electrically connected to the second wall plate 130.

While the second resistor-capacitor-inductor element 270 is connected to the middleware 430, the second resistor-capacitor-inductor element 270 is electrically connected to the corresponding second extension part 137. The middleware 430 may support a relative position of the second resistor-capacitor-inductor element 270, and the second extension part 137 enables the second resistor-capacitor-inductor element 270 to be electrically connected to the second wall plate 130. The second resistor-capacitor-inductor element 270 may be a resistor, a capacitor, or an inductor. A corresponding element is selected as the second resistor-capacitor-inductor element 270 according to an actual requirement of the substrate structure 001, so that each element in the substrate structure 001 is electrically connected to implement a required function.

In the accommodation cavity 101, a buffer cavity 101a is formed between the first wall plate 110, the connecting plate 150, and the cooling housing 400, and the buffer cavity 101a is filled with a buffer 170. Optionally, the buffer 170 is an ABF or PP. An impact force transfer between the first wall plate 110 and the second wall plate 130 may be buffered by filling the accommodation cavity 101 with the buffer 170, thereby improving strength of the substrate structure 001.

The substrate structure 001 further includes a plastic package 550 and a second insulation part 530.

The plastic package 550 covers surfaces of the outer housing component and the first wall plate 110. Components such as the frame body 100 of the substrate structure 001 may be protected with the plastic package 550 covering a surface that is of the substrate structure 001 and on which the first wall plate 110 is disposed, so that the substrate structure 001 may operate stably.

The second insulation part 530 is disposed on an end face that is of the second wall plate 130 and that is away from the first wall plate 110. The second insulation part 530 may be formed on a surface of the second wall plate 130 in a form of photoelectric chemical etching or the like. While protecting the second wall plate 130, the second insulation part 530 forms a second electrical connection region 503 at a position at which the second insulation part 530 is not disposed on the second wall plate 130. The second electrical connection region 503 may be configured to connect the substrate structure 001 to a PCB, to facilitate application of the substrate structure 001. An insulation region in which the second insulation part 530 is located may effectively prevent the substrate structure 001 from being affected by another electrical element, thereby ensuring normal operation of the substrate structure 001.

It may be understood that the plastic package 550 covers only the first wall plate 110 when the cooling housing 400 is entirely located in the accommodation cavity 101.

The substrate structure 001 may implement quick heat dissipation of the first chip 210, the first resistor-capacitor-inductor element 230, the second chip 250, and the second resistor-capacitor-inductor element 270 by filling the cooling cavity 401 with the cooling fluid 450, to maintain normal operation of the substrate structure 001. The cooling fluid 450 circulating in the first slot 131 between the first chip 210 and the second wall plate 130 may further enhance heat dissipation of the first chip 210. The cooling fluid 450 circulating in the second slot 133 between the first resistor-capacitor-inductor element 230 and the second wall plate 130 may further enhance heat dissipation of the first resistor-capacitor-inductor element 230.

Figure 9:
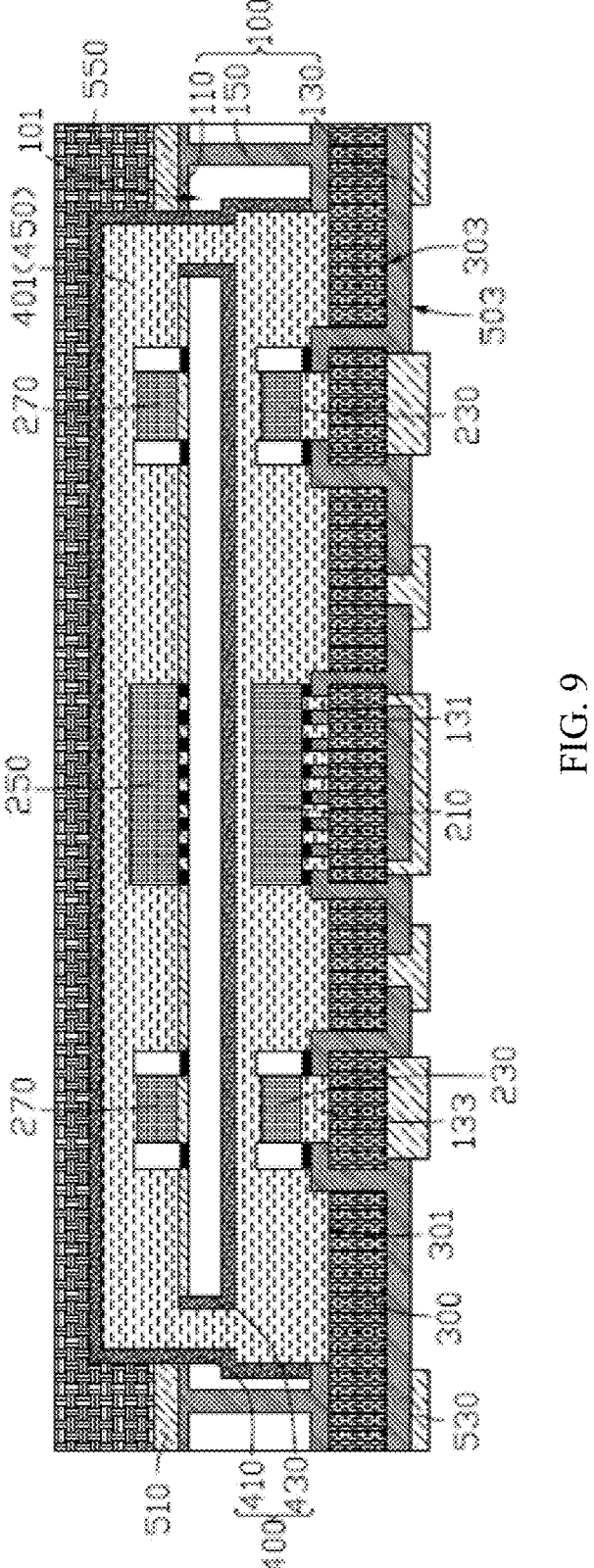
FIG. 9 is a schematic diagram of a structure of a substrate structure according to an embodiment of this application.

FIG. 9 is a schematic diagram of a structure of a substrate structure 001 according to an implementation of this application.

As shown in FIG. 9, the substrate structure 001 includes a frame body 100, a cooling housing 400, a copper clad laminate 300, a first chip 210, and a first resistor-capacitor-inductor element 230.

The frame body 100 is made of a conductor material. Optionally, the frame body 100 is made of copper, and has a relatively strong conductive property. The frame body 100 includes a first wall plate 110, a second wall plate 130, and a connecting plate 150. The first wall plate 110 and the second wall plate 130 are approximately parallel and disposed at a spacing. The first wall plate 110 is connected to the second wall plate 130 by using the connecting plate 150, so that the first wall plate 110 is electrically connected to the second wall plate 130. The first wall plate 110 and the second wall plate 130 may be separately wired, so that each element may implement a function thereof after each element in the substrate structure 001 is electrically connected to the first wall plate 110 or the second wall plate 130.

It may be understood that the first wall plate 110 may not need to be separately wired if the first wall plate 110 does not need to be mounted with a resistor-capacitor-inductor element.

The copper clad laminate 300 is disposed on a surface that is of the second wall plate 130 and that is close to the first wall plate 110, and the copper clad laminate 300 is relatively fastened to the second wall plate 130. Because the copper clad laminate 300 has specific strength, the substrate structure 001 may have higher strength after the copper clad laminate 300 is relatively fastened to the second wall plate 130. When the substrate structure 001 has a tendency to bend due to an external force, the copper clad laminate 300 may reduce a bending degree of the substrate structure 001.

An accommodation cavity 101 is formed between the first wall plate 110 and the second wall plate 130. A mounting opening is disposed on the first wall plate 110. A part of the cooling housing 400 is located in the accommodation cavity 101, and the other part of the cooling housing 400 extends out of the accommodation cavity 101 from the mounting opening. The cooling housing 400 includes an outer housing component 410 and middleware 430, and the middleware 430 is located in the outer housing component 410. One end of the outer housing component 410 has an opening 403, and one end of the opening 403 is connected to the second wall plate 130 in a sealed manner. The outer housing component 410, the copper clad laminate 300, and the second wall plate 130 jointly form a cooling cavity 401. The cooling cavity 401 is located between the cooling housing 400 and the second wall plate 130. The first chip 210 and the first resistor-capacitor-inductor element 230 are located in the cooling cavity 401, and are located on a surface that is of the copper clad laminate 300 and that is away from the second wall plate 130. The first chip 210 and the first resistor-capacitor-inductor element 230 are not in direct contact with the cooling housing 400. The cooling cavity 401 is filled with cooling fluid 450, and the cooling fluid 450 immerses the first chip 210 and the first resistor-capacitor-inductor element 230. When the first chip 210 and the first resistor-capacitor-inductor element 230 generate heat during operation, the cooling fluid 450 may quickly take the heat away from the first chip 210 and the first resistor-capacitor-inductor element 230. Optionally, the cooling housing 400 is made of metal, ceramic, or plastic, so that the cooling housing 400 has specific strength, and may maintain a shape of the cooling housing 400 when the substrate structure 001 operates.

The second wall plate 130 includes a first extension part 135, and the first extension part 135 passes through the copper clad laminate 300. The first extension part 135 corresponding to the first chip 210 is electrically connected to a plurality of spaced first connectors at one end close to the chip. The first connectors are electrically connected to the first chip 210, and a first slot 131 is provided between two adjacent first connectors. The first chip 210 is connected to the first connectors, that is, implementing an electrical connection between the first chip 210 and the second wall plate 130.

The first extension part 135 corresponding to the first resistor-capacitor-inductor element 230 is electrically connected to two second connectors at one end close to the first resistor-capacitor-inductor element 230. The second connectors are electrically connected to the first resistor-capacitor-inductor element 230, and a second slot 133 is provided between the two second connectors. The first resistor-capacitor-inductor element 230 is connected to the second connectors, that is, implementing an electrical connection between the first resistor-capacitor-inductor element 230 and the second wall plate 130. The first resistor-capacitor-inductor element 230 may be a resistor, a capacitor, or an inductor. A corresponding element is selected as the first resistor-capacitor-inductor element 230 according to an actual requirement of the substrate structure 001, so that each element in the substrate structure 001 is electrically connected to implement a required function.

The cooling fluid 450 may further flow through the first slot 131, to take away heat of one end that is of the first chip 210 and that is close to the copper clad laminate 300. Similarly, the cooling fluid 450 may further flow through the second slot 133, to take away heat of one end that is of the first resistor-capacitor-inductor element 230 and that is close to the copper clad laminate 300.

The cooling fluid 450 is insulation and heat-conducting fluid, and an insulation characteristic of the cooling fluid 450 may maintain normal operation of the first chip 210 and the first resistor-capacitor-inductor element 230. Optionally, the cooling fluid 450 is transformer oil or fluoride liquid, has a relatively good thermal conductivity, and may immerse in a narrow slot of a chip or a resistor-capacitor-inductor element and take away heat at the slot, thereby achieving a better cooling effect.

In the accommodation cavity 101, a buffer cavity 101a is formed between the first wall plate 110, the connecting plate 150, and the cooling housing 400, and the buffer cavity 101a is filled with a buffer 170. Optionally, the buffer 170 is an ABF or PP. An impact force transfer between the first wall plate 110 and the second wall plate 130 may be buffered by filling the accommodation cavity 101 with the buffer 170, thereby improving strength of the substrate structure 001.

The substrate structure 001 further includes a plastic package 550 and a second insulation part 530.

The plastic package 550 covers surfaces of the outer housing component and the first wall plate 110. Components such as the frame body 100 of the substrate structure 001 may be protected with the plastic package 550 covering a surface that is of the substrate structure 001 and on which the first wall plate 110 is disposed, so that the substrate structure 001 may operate stably.

The second insulation part 530 is disposed on an end face that is of the second wall plate 130 and that is away from the first wall plate 110. The second insulation part 530 may be formed on a surface of the second wall plate 130 in a form of photoelectric chemical etching or the like. While protecting the second wall plate 130, the second insulation part 530 forms a second electrical connection region 503 at a position at which the second insulation part 530 is not disposed on the second wall plate 130. The second electrical connection region 503 may be configured to connect the substrate structure 001 to a PCB, to facilitate application of the substrate structure 001. An insulation region in which the second insulation part 530 is located may effectively prevent the substrate structure 001 from being affected by another electrical element, thereby ensuring normal operation of the substrate structure 001.

It may be understood that the plastic package 550 covers only the first wall plate 110 when the cooling housing 400 is entirely located in the accommodation cavity 101.

The substrate structure 001 may implement quick heat dissipation of the first chip 210 and the first resistor-capacitor-inductor element 230 by filling the cooling cavity 401 with the cooling fluid 450, to maintain normal operation of the substrate structure 001. The cooling fluid 450 circulating in the first slot 131 between the first chip 210 and the second wall plate 130 may further enhance heat dissipation of the first chip 210.

Figure 10:
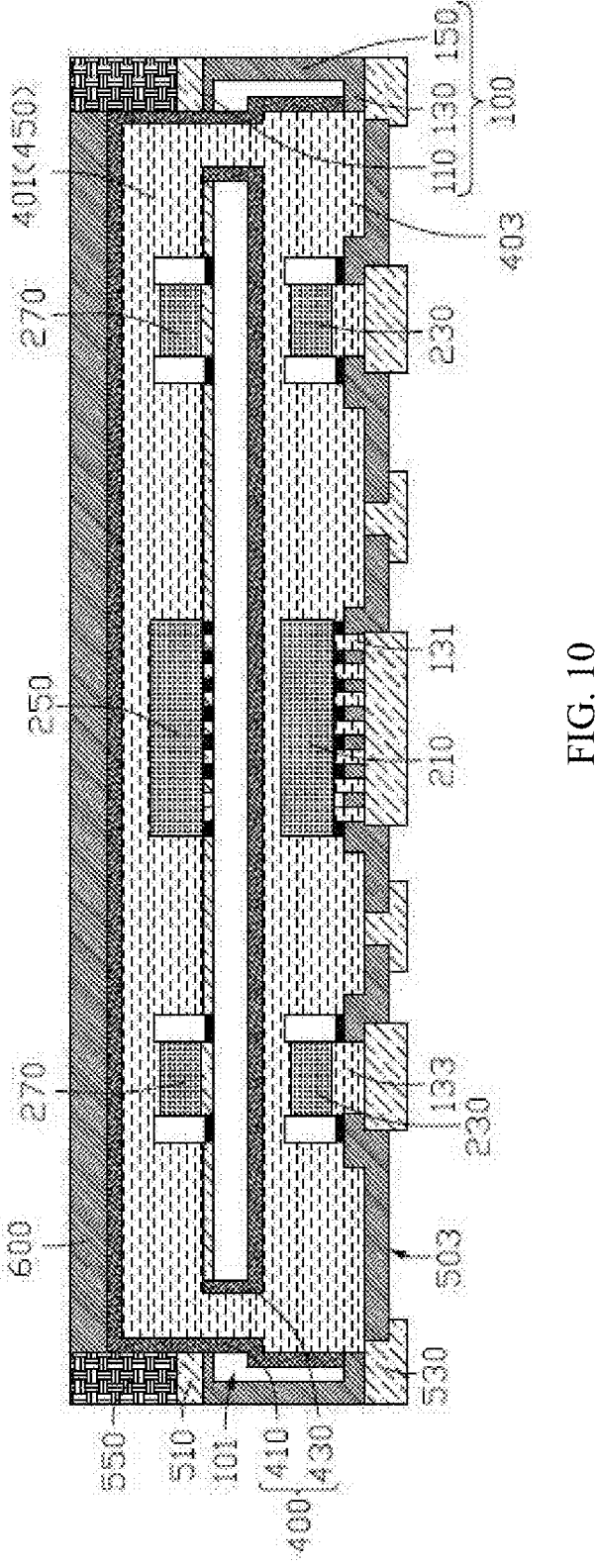
FIG. 10 is a schematic diagram of a structure of a substrate structure according to an embodiment of this application.

FIG. 10 is a schematic diagram of a structure of a substrate structure 001 according to an implementation of this application.

Based on the substrate structure 001 shown in FIG. 8, the substrate structure 001 further includes a heat dissipation member 600.

The plastic package 550 has a window, and the heat dissipation member 600 is disposed at the window. The heat dissipation member 600 cooperates with the outer housing component through contact, and heat of the cooling housing 400 may be dissipated by using the heat dissipation member 600.

Optionally, the heat dissipation member 600 is a metal member, and the metal member has a relatively high thermal conductivity, so that heat of the outer housing component is quickly taken away, to implement cooling of the cooling housing 400.

Optionally, the heat dissipation member 600 includes a plurality of heat dissipation fins, and the heat dissipation fins are located on a surface that is of the heat dissipation member 600 and that is away from the cooling housing 400. Heat dissipation efficiency may be improved by using the heat dissipation fins.

Optionally, the heat dissipation member 600 is a vapor chamber (VC). After entering the heat dissipation member 600, heat of the outer housing component may be quickly conducted, and dissipated evenly at an end away from the outer housing component.

It may be understood that the plastic package 550 may alternatively not have a window. The heat dissipation member 600 is disposed on a surface that is of the plastic package 550 and that is away from the first wall plate 110. The heat dissipation member 600 may also accelerate heat dissipation of the substrate structure 001.

It may be understood that while cooperating with the outer housing component through contact, the heat dissipation member 600 may cooperate with the first wall plate 110 through contact. The heat dissipation member 600 may also accelerate heat dissipation of the substrate structure 001.

It may be understood that when the cooling housing 400 is completely located in the accommodation cavity 101, the heat dissipation member 600 may cooperate with the first wall plate 110 through contact, to dissipate heat for the first wall plate 110. The heat dissipation member 600 may also accelerate heat dissipation of the substrate structure 001.

The substrate structure 001 may implement quick heat dissipation of the first chip 210 and the first resistor-capacitor-inductor element 230 by filling the cooling cavity 401 with the cooling fluid 450, to maintain normal operation of the substrate structure 001. The cooling fluid 450 dissipates heat by using the heat dissipation member 600, and the heat dissipation member 600 may enhance heat dissipation of the cooling fluid 450.

Figure 11:
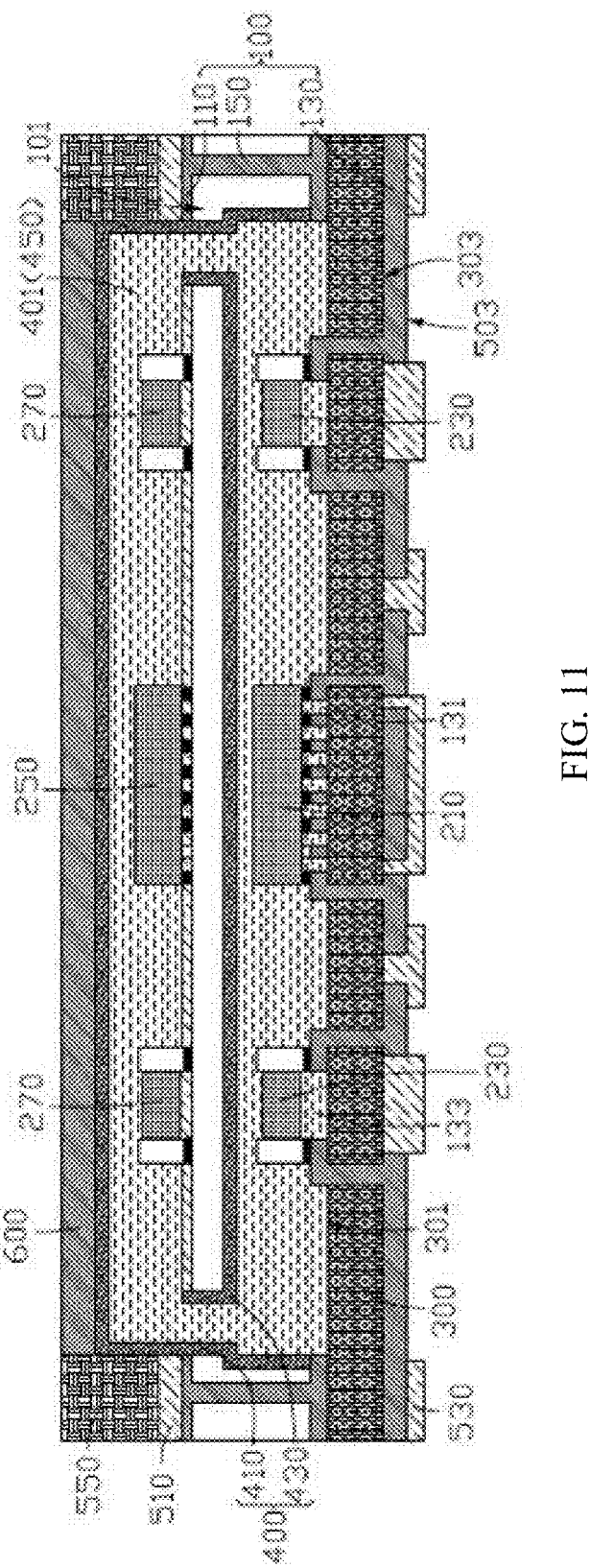
FIG. 11 is a schematic diagram of a structure of a substrate structure according to an embodiment of this application.

FIG. 11 is a schematic diagram of a structure of a substrate structure 001 according to an implementation of this application.

Based on the substrate structure 001 shown in FIG. 9, the substrate structure 001 further includes a heat dissipation member 600.

The plastic package 550 has a window, and the heat dissipation member 600 is disposed at the window. The heat dissipation member 600 cooperates with the outer housing component through contact, and heat of the cooling housing 400 may be dissipated by using the heat dissipation member 600.

Optionally, the heat dissipation member 600 is a metal member, and the metal member has a relatively high thermal conductivity, so that heat of the outer housing component is quickly taken away, to implement cooling of the cooling housing 400.

Optionally, the heat dissipation member 600 includes a plurality of heat dissipation fins, and the heat dissipation fins are located on a surface that is of the heat dissipation member 600 and that is away from the cooling housing 400. Heat dissipation efficiency may be improved by using the heat dissipation fins.

Optionally, the heat dissipation member 600 is a VC. After entering the heat dissipation member 600, heat of the outer housing component may be quickly conducted, and dissipated evenly at an end away from the outer housing component.

It may be understood that the plastic package 550 may alternatively not have a window. The heat dissipation member 600 is disposed on a surface that is of the plastic package 550 and that is away from the first wall plate 110. The heat dissipation member 600 may also accelerate heat dissipation of the substrate structure 001.

It may be understood that while cooperating with the outer housing component through contact, the heat dissipation member 600 may cooperate with the first wall plate 110 through contact. The heat dissipation member 600 may also accelerate heat dissipation of the substrate structure 001.

It may be understood that when the cooling housing 400 is completely located in the accommodation cavity 101, the heat dissipation member 600 may cooperate with the first wall plate 110 through contact, to dissipate heat for the first wall plate 110. The heat dissipation member 600 may also accelerate heat dissipation of the substrate structure 001.

The substrate structure 001 may implement quick heat dissipation of the first chip 210 and the first resistor-capacitor-inductor element 230 by filling the cooling cavity 401 with the cooling fluid 450, to maintain normal operation of the substrate structure 001. The cooling fluid 450 dissipates heat by using the heat dissipation member 600, and the heat dissipation member 600 may enhance heat dissipation of the cooling fluid 450.

Figure 12:
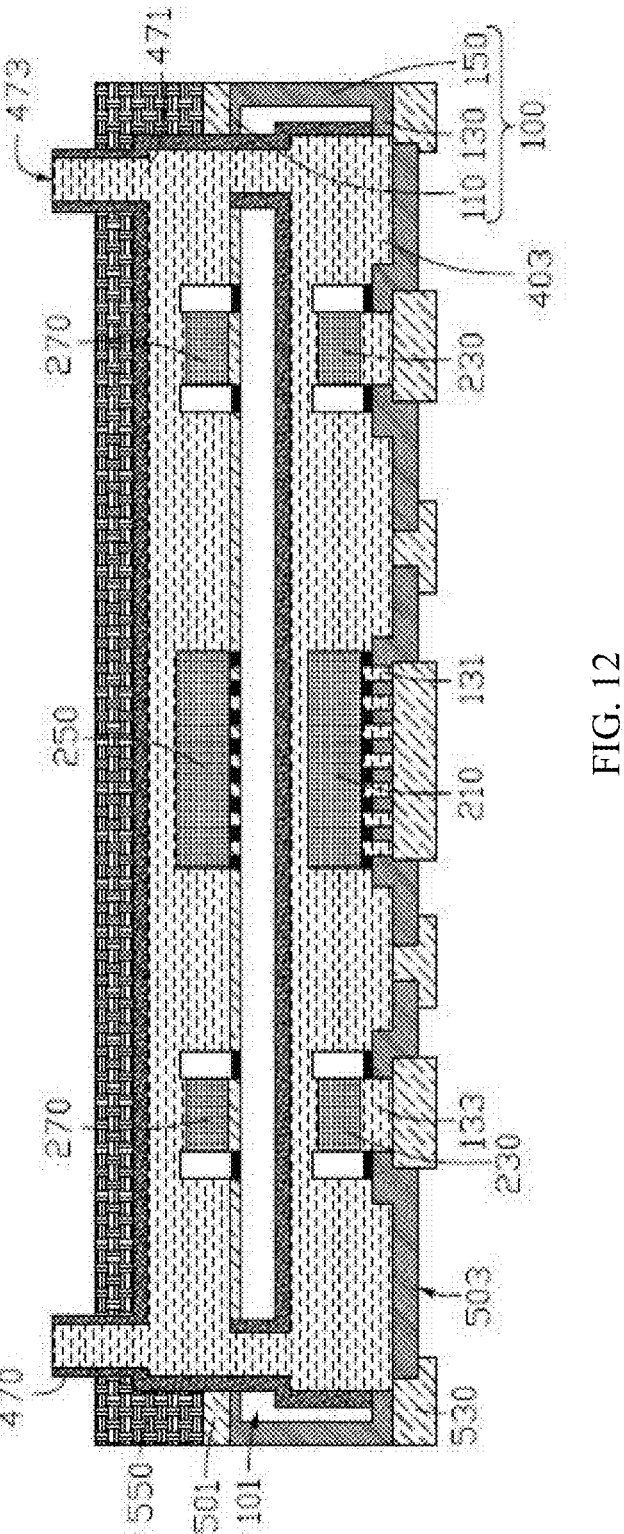
FIG. 12 is a schematic diagram of a structure of a substrate structure according to an embodiment of this application.

FIG. 12 is a schematic diagram of a structure of a substrate structure 001 according to an implementation of this application.

Based on the substrate structure 001 shown in FIG. 8, the substrate structure 001 further includes two cooling pipes 470. The two cooling pipes 470 are located on two opposite sides of the cooling housing 400.

The cooling pipes 470 include a first connection end 471 and a second connection end 473 that are opposite to each other, and the first connection end 471 is directly connected to the second connection end 473.

The first connection end 471 is connected to the cooling cavity 401, so that the cooling fluid 450 in the cooling cavity 401 may enter the cooling pipes 470, and the cooling fluid 450 may also be provided for the cooling cavity 401 by using the cooling pipes 470.

The second connection end 473 is configured to connect a circulation apparatus.

The circulation apparatus includes a circulation pump, a pump outlet, and a pump inlet, and provides power for the cooling fluid through the circulation pump, so that the fluid may enter from the pump inlet and then flow out from the pump outlet at a specific speed. One of the two cooling pipes 470 serves as a first pipe, and the other serves as a second pipe. The second connection end 473 of the first pipe is connected to the pump inlet, and the second connection end 473 of the second pipe is connected to the pump outlet. When the circulation apparatus is started, the first pipe leads out the cooling fluid 450 in the cooling cavity 401. The cooling fluid 450 flows through the circulation pump, and then flows out from the pump outlet. The cooling fluid 450 flowing out from the pump outlet enters the cooling cavity 401 through the second pipe, to implement circulation of the cooling fluid 450.

An active cooling structure may further be disposed in the circulation apparatus, and the cooling fluid 450 flowing through the circulation apparatus is cooled by using the active cooling structure.

The cooling fluid 450 in the substrate structure 001 may have strong fluidity, and may provide a better heat dissipation effect for the first chip 210, the first resistor-capacitor-inductor element 230, the second chip 250, and the second resistor-capacitor-inductor element 270.

Figure 13:
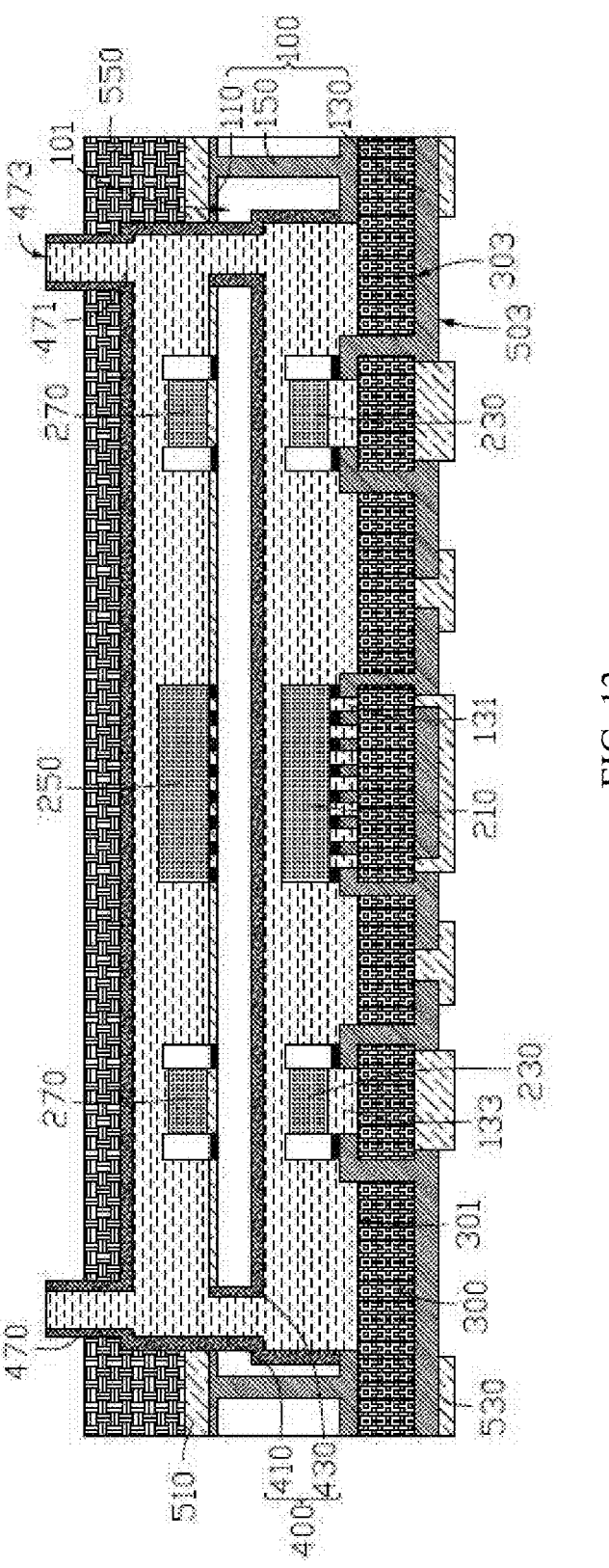
FIG. 13 is a schematic diagram of a structure of a substrate structure according to an embodiment of this application.

FIG. 13 is a schematic diagram of a structure of a substrate structure 001 according to an implementation of this application.

Based on the substrate structure 001 shown in FIG. 9, the substrate structure 001 further includes two cooling pipes 470. The two cooling pipes 470 are located on two opposite sides of the cooling housing 400.

The cooling pipes 470 include a first connection end 471 and a second connection end 473 that are opposite to each other, and the first connection end 471 is directly connected to the second connection end 473.

The first connection end 471 is connected to the cooling cavity 401, so that the cooling fluid 450 in the cooling cavity 401 may enter the cooling pipes 470, and the cooling fluid 450 may also be provided for the cooling cavity 401 by using the cooling pipes 470.

The second connection end 473 is configured to connect a circulation apparatus.

The circulation apparatus includes a circulation pump, a pump outlet, and a pump inlet, and provides power for the cooling fluid through the circulation pump, so that the fluid may enter from the pump inlet and then flow out from the pump outlet at a specific speed. One of the two cooling pipes 470 serves as a first pipe, and the other serves as a second pipe. The second connection end 473 of the first pipe is connected to the pump inlet, and the second connection end 473 of the second pipe is connected to the pump outlet. When the circulation apparatus is started, the first pipe leads out the cooling fluid 450 in the cooling cavity 401. The cooling fluid 450 flows through the circulation pump, and then flows out from the pump outlet. The cooling fluid 450 flowing out from the pump outlet enters the cooling cavity 401 through the second pipe, to implement circulation of the cooling fluid 450.

An active cooling structure may further be disposed in the circulation apparatus, and the cooling fluid 450 flowing through the circulation apparatus is cooled by using the active cooling structure.

The cooling fluid 450 in the substrate structure 001 may have strong fluidity, and may provide a better heat dissipation effect for the first chip 210, the first resistor-capacitor-inductor element 230, the second chip 250, and the second resistor-capacitor-inductor element 270.

This application further provides a terminal device. The terminal device includes a device body and the foregoing substrate structure 001. The substrate structure 001 is disposed in the device body.

In the terminal device, the first chip 210 may maintain a relatively low operating temperature by immersion cooling, so that the terminal device may operate stably for a long time.

The foregoing descriptions are implementations of this application, and are not intended to limit the protection scope of this application. Any variation or replacement within the technical scope disclosed in this application shall fall within the protection scope of this application.

What is claimed is:

1. A substrate structure, comprising:
a frame body comprising:
a first wall plate comprising a first wall plate surface;
a second wall plate that is spaced apart from the first wall plate, wherein the second wall plate is away from the first wall plate surface; and
an accommodation cavity between the first wall plate and the second wall plate;
a plastic package, wherein the plastic package covers the first wall plate surface;
a cooling housing at least partially disposed in the accommodation cavity and fastened to the frame body;
a cooling cavity between the cooling housing and the second wall plate; and
a first chip disposed in the cooling cavity, located in the accommodation cavity, and connected to the second wall plate, wherein the cooling cavity is configured to be filled by cooling fluid that immerses the first chip.

2. The substrate structure of claim 1, wherein the first wall plate further comprises a first wall plate end face, wherein the substrate structure further comprises a first insulation part, and wherein the first insulation part is disposed on the first wall plate end face and away from the second wall plate to form a first electrical connection region on the first wall plate surface.

3. The substrate structure of claim 1, wherein the second wall plate comprises a second wall plate surface and a second wall plate end face, wherein the substrate structure further comprises a second insulation part, wherein the second insulation part is disposed on the second wall plate end face and away from the first wall plate to form a second electrical connection region on the second wall plate surface.

4. The substrate structure of claim 1, further comprising a buffer between the first wall plate and the cooling housing in the accommodation cavity, wherein the buffer is configured to buffer an impact force between the first wall plate and the second wall plate.

5. The substrate structure of claim 1, further comprising a copper clad laminate comprising a first copper clad laminate surface and a second copper clad laminate surface, wherein the copper clad laminate is fastened to the frame body, wherein the copper clad laminate is disposed between the second wall plate and the first chip, wherein the first copper clad laminate surface is away from the second wall plate and forms a first wiring surface, and wherein the second copper clad laminate surface is close to the second wall plate and forms a second wiring surface.

6. The substrate structure of claim 1, further comprising two cooling pipes, wherein each of the two cooling pipes comprise a first connection end and a second connection end that are connected, wherein the first connection end of each of the two cooling pipes is connected to the cooling cavity, and wherein the second connection end of each of the two cooling pipes is configured to connect a circulation apparatus that supplies the cooling fluid.

7. The substrate structure of claim 1, further comprising a first resistor-capacitor-inductor element, wherein the first resistor-capacitor-inductor element is disposed in the cooling cavity and is connected to the second wall plate.

8. The substrate structure of claim 7, further comprising:
a first insulation film that covers a first chip surface of the first chip; and
a second insulation film that covers a first resistor-capacitor-inductor element surface of the first resistor-capacitor-inductor element.

9. The substrate structure of claim 1, further comprising a second chip, wherein the cooling housing comprises an outer housing component and middleware, wherein the cooling cavity is formed between the outer housing component and the second wall plate, wherein the middleware is disposed in the cooling cavity, wherein the middleware is fastened to the outer housing component, and wherein the second chip is connected to the middleware.

10. The substrate structure of claim 9, further comprising a second resistor-capacitor-inductor element, wherein the second resistor-capacitor-inductor element is disposed in the cooling cavity and is connected to the middleware.

11. The substrate structure of claim 1, wherein the first wall plate comprises a mounting opening, wherein the cooling housing extends out of the accommodation cavity from the mounting opening, wherein the cooling housing comprises a cooling housing surface that is away from the second wall plate, and wherein the plastic package covers the first wall plate and the cooling housing surface.

12. The substrate structure of claim 1, wherein the substrate structure further comprises a heat dissipation member, and wherein the heat dissipation member is disposed on the first wall plate surface.

13. The substrate structure of claim 1, wherein the first chip is connected to the second wall plate using a plurality of first connectors, wherein the first connectors form a first slot between the first connectors, and wherein the first slot is configured to circulate the cooling fluid.

14. A terminal device, comprising:
a device body; and
a substrate structure disposed in the device body, wherein the substrate structure comprises:
a frame body comprising:
a first wall plate comprising a first wall plate surface and a first wall plate end face;
a second wall plate that is spaced apart from the first wall plate; and
an accommodation cavity between the first wall plate and the second wall plate;

a first insulation part, wherein the first insulation part is disposed on the first wall plate end face and away from the second wall plate to form a first electrical connection region on the first wall plate surface;

a cooling housing at least partially disposed in the accommodation cavity and fastened to the frame body;

a cooling cavity between the cooling housing and the second wall plate; and a first chip disposed in the cooling cavity, located in the accommodation cavity, and connected to the second wall plate, wherein the cooling cavity is configured to be filled by cooling fluid that immerses the first chip.

15. The terminal device of claim 14, wherein the second wall plate comprises a second wall plate surface and a second wall plate end face, wherein the substrate structure further comprises a second insulation part, wherein the second insulation part is disposed on the second wall plate end face and away from the first wall plate to form a second electrical connection region on the second wall plate surface.

16. The terminal device of claim 14, further comprising a buffer between the first wall plate and the cooling housing in the accommodation cavity, wherein the buffer is configured to buffer an impact force between the first wall plate and the second wall plate.

17. The terminal device of claim 14, wherein the substrate structure further comprises a copper clad laminate comprising a first copper clad laminate surface and a second copper clad laminate surface, wherein the copper clad laminate is fastened to the frame body, wherein the copper clad laminate is disposed between the second wall plate and the first chip, wherein the first copper clad laminate surface is away from the second wall plate and forms a first wiring surface, and wherein the second copper clad laminate surface is close to the second wall plate and forms a second wiring surface.

18. The terminal device of claim 14, wherein the substrate structure further comprises a first resistor-capacitor-inductor element, wherein the first resistor-capacitor-inductor element is disposed in the cooling cavity and is connected to the second wall plate.

19. A substrate structure, comprising:

a frame body comprising:

a first wall plate comprising a first wall plate surface;

a second wall plate that is spaced apart from the first wall plate surface; and an accommodation cavity between the first wall plate and the second wall plate;

a cooling housing at least partially disposed in the accommodation cavity and fastened to the frame body;

a heat dissipation member disposed on the first wall plate surface;

a cooling cavity between the cooling housing and the second wall plate; and a first chip disposed in the cooling cavity, located in the accommodation cavity, and connected to the second wall plate, wherein the cooling cavity is configured to be filled by cooling fluid that immerses the first chip.

20. The substrate structure of claim 19, wherein the first wall plate further comprises a first wall plate end face, wherein the substrate structure further comprises a first insulation part, and wherein the first insulation part is disposed on the first wall plate end face and away from the second wall plate to form a first electrical connection region on the first wall plate surface.

\* \* \* \* \*